United States Patent
Nagaya et al.

(10) Patent No.: US 6,383,909 B1
(45) Date of Patent: May 7, 2002

(54) SEMICONDUCTOR DEVICE WITH A CORROSION RESISTANT BONDING PAD AND MANUFACTURING METHOD THEREFOR

(75) Inventors: Kazuhisa Nagaya; Naoshi Arikawa, both of Kumamoto (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/855,720

(22) Filed: May 16, 2001

(30) Foreign Application Priority Data

May 16, 2000 (JP) ......................................... 2000-142689

(51) Int. Cl.⁷ ........................................... H01L 21/4763
(52) U.S. Cl. ...................................... 438/617; 438/612
(58) Field of Search .................................. 438/612, 617

(56) References Cited

U.S. PATENT DOCUMENTS

| | | | | |
|---|---|---|---|---|
| 4,517,734 A | * | 5/1985 | Rubin | 29/577 |
| 4,860,941 A | * | 8/1989 | Otto | 228/179 |
| 5,565,378 A | * | 10/1996 | Harada et al. | 437/182 |

FOREIGN PATENT DOCUMENTS

| | | |
|---|---|---|
| JP | 59-150460 | 8/1984 |
| JP | 63-272042 | 11/1988 |
| JP | 1-110749 | 4/1989 |
| JP | 5-46978 | 7/1993 |

\* cited by examiner

*Primary Examiner*—John F. Niebling
*Assistant Examiner*—David A. Zarneke
(74) *Attorney, Agent, or Firm*—Young & Thompson

(57) ABSTRACT

A semiconductor device having a bonding pad, includes an alumina layer formed on a surface of the bonding pad before bonding a bonding wire to the bonding pad to prevent the surface of the bonding pad from degenerating during storage while awaiting the bonding step. A method of manufacturing a semiconductor device with such a bonding pad includes the steps of: forming an inter-layer insulating film, an aluminum layer, and a passivation film successively on a semiconductor substrate; forming a photosensitive resin film on the passivation film; opening a bonding pad by exposing a part of the aluminum layer with photolithographic etching using a fluorine gas etching; and baking the device in a water vapor atmosphere at a predetermined temperature and baking time to form the alumina layer.

9 Claims, 7 Drawing Sheets

SEMICONDUCTOR DEVICE WITH A CORROSION RESISTANT BONDING PAD AND MANUFACTURING METHOD THEREFOR

BACKGROUND OF THE INVENTION

1. Field of the Invention

The present invention relates to a semiconductor device, and more particularly to a semiconductor device in which reaction products such as aluminum hydroxide are prevented from forming on a bonding pad, and a method of manufacturing such a device.

2. Description of Related Art

Materials with aluminum as the main constituent, for example Al, Al—Cu, and Al—Si—Cu, have been used for metal wiring in semiconductor devices. Bonding pads are formed by selectively exposing such metal wiring. When openings are formed for bonding pads, the metal wiring exposed by the openings reacts with moisture in the air at room temperature. The aluminum in the wiring is thereby transformed into aluminum hydroxide, since aluminum is a very active element. Aluminum hydroxide can form in about two weeks where temperature and humidity are not controlled.

As shown in FIG. 8, an inter-layer insulating film 2, a barrier metal film 3, an aluminum layer 4, an antireflection metal film 5, and a passivation film 6 are formed as a multi-layer structure on a semiconductor substrate 1. Furthermore, a photosensitive polyimide layer (or photoresist) 7 is formed on the passivation film 6, and the passivation film (protective film) 6 is selectively removed by dry etching to form an opening 8 using the polyimide layer 7 as a mask. This opening 8 exposes the aluminum layer 4 as bonding pad 11. If this opening 8 is left as is, an aluminum hydroxide layer 12 will form as a reaction product on the surface of aluminum layer 4.

Such an aluminum hydroxide layer 12 hinders a eutectic state between aluminum serving as the bonding pad and the bonding wire (Au or Al wire) in the subsequent bonding process, and therefore decreases the bonding yield. Therefore, in the method of manufacturing a semiconductor device, to minimize the degeneration of the surface of the bonding pad, it is common to keep the device in a controlled temperature and humidity, or confined in dry air after the front-end process (the completion of the bonding pad forming step) until the assembly is completed.

After the bonding pad is formed, the semiconductor device is completed by bonding the bonding pad to an external lead, such as a lead frame, with a metal wire, and then packaging. However, packaging is performed with the bonding area exposed to air. Thus, the surface of the aluminum serving as bonding pad reacts with moisture in the air. Accordingly, the surface of the bonding pad degenerates and erodes, and the characteristics of the semiconductor device degrade.

To solve this problem, Japanese Patent Kokai No. Sho 59-150460, No. Sho 63-272042, No. Hei 1-110749, and No. Hei 5-46978 disclose that after the bonding step, the surface of the bonding pad is covered with an insulating film, such as aluminum oxide, to prevent the aluminum serving as the bonding pad from degenerating.

However, in the conventional manufacturing method of a semiconductor device, the device must be kept in a controlled temperature and humidity or confined in dry air until the assembly is completed. Consequently, handling and storage facilities are needed for keeping the device in the proper atmosphere and additional time is required for transporting the device to the storage place.

Moreover, according to the above patents, the aluminum oxide is formed after the bonding step, and therefore the device must be kept in the above described storage place from the bonding pad forming step (front-end process) until the assembly is completed.

SUMMARY OF THE INVENTION

The object of the present invention is to provide a semiconductor device and a method of manufacturing a semiconductor device that prevents the surface of the bonding pad from degenerating until the assembly is completed.

A semiconductor device according to the present invention comprises a semiconductor substrate; a wiring layer on the semiconductor substrate; a passivation film on the wiring layer, the passivation film having a hole selectively formed to expose a surface of the wiring layer serving as a bonding pad; and an oxide layer covering all of the wiring layer exposed by the hole.

A method of manufacturing a semiconductor device according to the present invention comprises the steps of: forming a wiring layer on a semiconductor substrate; forming a passivation film on the wiring layer; selectively forming a hole in the passivation film to expose a surface of the wiring layer; and forming an aluminum oxide film on the exposed surface of the wiring layer before bonding a bonding wire to the exposed surface.

These and other objects of the present invention will be apparent to those of skill in the art from the appended claims when read in light of the following specification and accompanying figures.

DETAILED DESCRIPTION OF THE PREFERRED EMBODIMENTS

The structure of a semiconductor device according to an embodiment of the present invention will now be described.

Figure 1A:
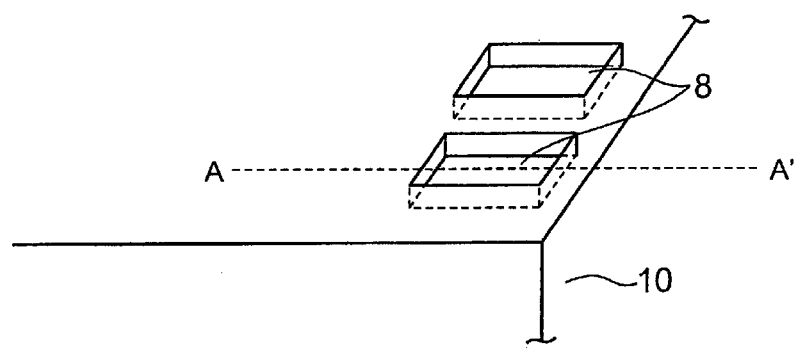
FIGS. 1A and 1B are a perspective view and a cross sectional view of the structure of a device after a bonding pad formed by etching, respectively.
Figure 1B:
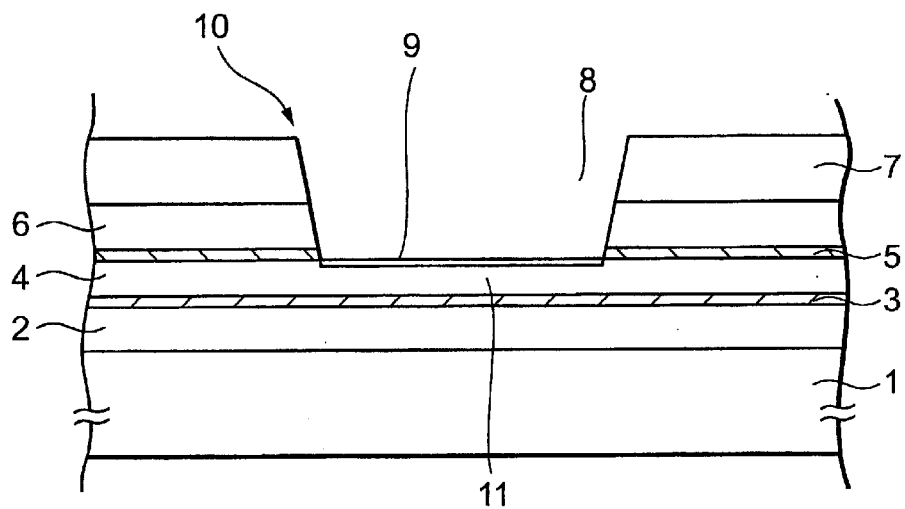

FIG. 1A is perspective view of a part of the semiconductor device 10 after exposing bonding pads. FIG. 1B is a cross-sectional view taken along line A–A' of FIG. 1A. As shown in FIG. 1B, an inter-layer insulating film 2, a barrier metal film 3, a first layer 4 having aluminum as its primary constituent (such as Al, Al—Cu, and Al—Si—Cu), an antireflection metal film 5, and a passivation film 6 are formed as a multi-layer structure on a semiconductor substrate 1. A photosensitive polyimide layer (or photo-resist) 7 is formed as a mask for an opening 8 on the passivation film 6. The opening 8 is formed to expose a portion of the first layer 4 serving as a bonding pad 11.

Furthermore, an alumina layer 9 ($Al_2O_3$, aluminum oxide) of 10 to 20 nm thickness is formed on the surface of the bonding pad 11 before the bonding step. Alumina is chemically very stable, so that alumina protects the surface of the bonding pad and prevents the surface of the bonding pad from degenerating. As described above in the conventional method of manufacturing a semiconductor device, to prevent the surface of the bonding pad from degenerating, the device is normally kept in controlled temperature and humidity after the front-end process until the assembly is completed because degeneration of the surface of the bonding pad decreases the yield in the bonding step. However, according to the present invention, good bonding characteristics and a high bonding yield are achievable in the bonding step of the back-end process (an assembly step) without storing the device in a controlled environment as in the conventional way because the alumina layer protects the surface of the bonding pad.

Figure 1C:
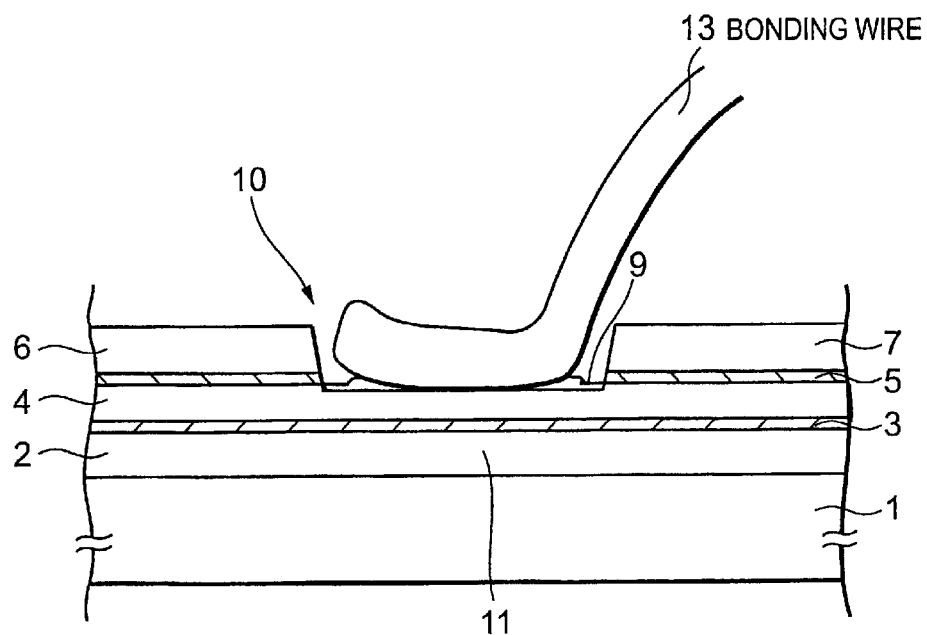
FIG. 1C is a cross sectional view of the structure of a device after a bonding step.

As shown in FIG. 1C, the bonding wire 13 is bonded to the bonding pad 11 by the supersonic wave bonding method. The bonding wire 13 pushes the alumina layer 9 with supersonic wave, and the alumina layer 9 is displaced. As a result, the bonding wire 13 contacts the bonding pad 11, and the bonding wire can be sufficiently alloyed with the bonding pad 11 by heat energy. That is, the bonding wire is sufficiently alloyed with the bonding pad by the general supersonic wave bonding method, if the alumina layer, which is insulation, is 10 to 20 nm thick. Therefore, bonding characteristics are not influenced by the presence of the alumina layer.

Figure 2:
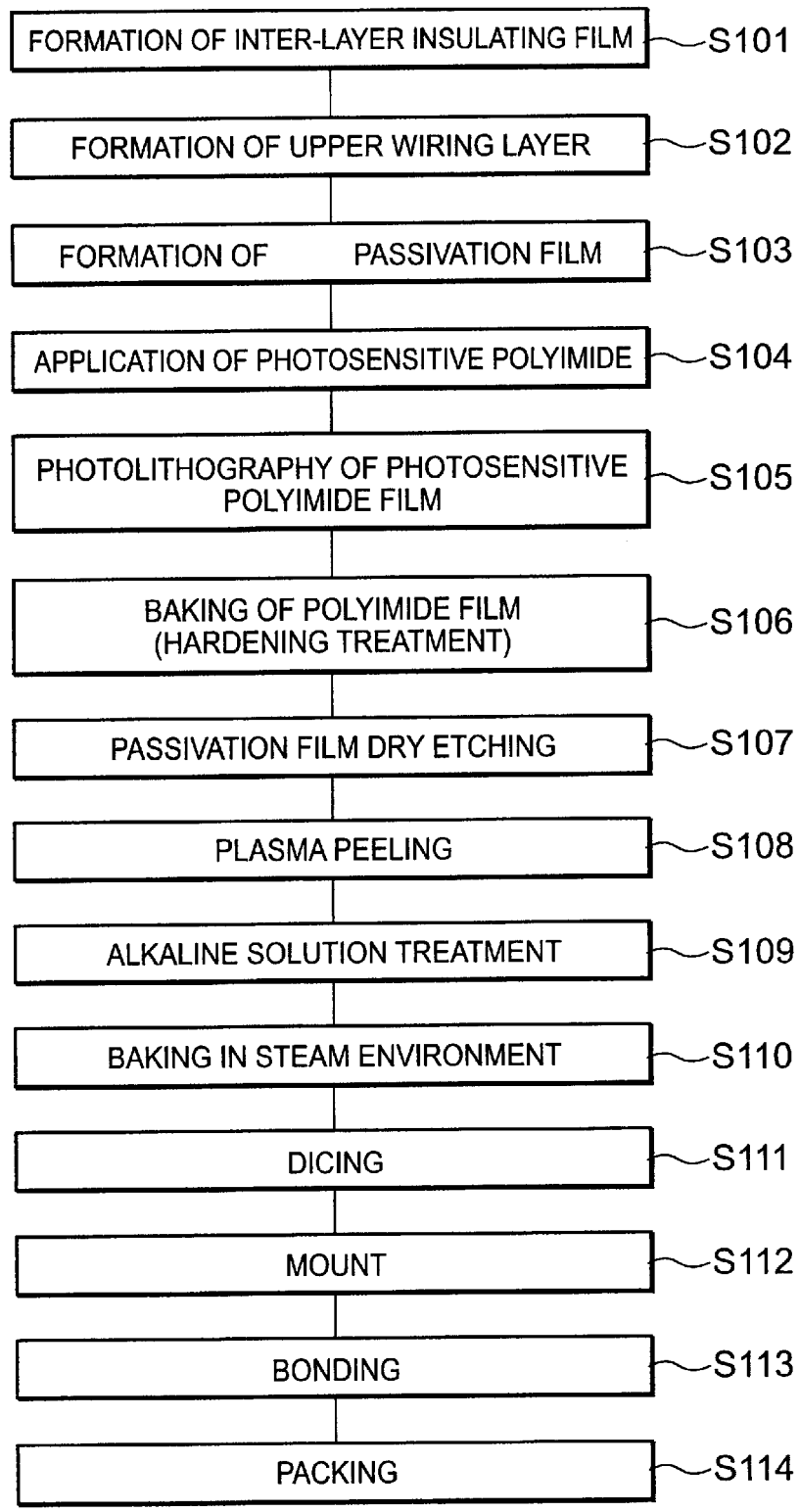
FIG. 2 is a flow chart showing the manufacturing method of a semiconductor device in the first embodiment of the present invention.

The manufacturing method of a semiconductor device according to an embodiment in the present invention will be described with reference to FIG. 2.

First, an inter-layer insulating film is formed on the semiconductor substrate (S101) before the formation of the uppermost wiring layer. Next, the uppermost wiring layer is patterned on the inter-layer insulating film (S102), and an insulating film is formed on the wiring layer to passivate the wiring layer (S103). The wiring layer has aluminum as its main constituent. Subsequently, a photosensitive polyimide layer is applied on the insulating film (S104) and photolithography is performed on the photosensitive polyimide layer (S105). The semiconductor device including the photosensitive polyimide layer is baked in a nitrogen atmosphere at 380° C. for about 1 hour to harden the polyimide (S106). Dry etching is performed in a fluorine gas using the polyimide layer as a mask (S107). After dry etching, an $O_2$ plasma process is performed and the device is soaked in an alkaline solution (S108, S109) in order to remove reaction products of the dry etching. Next, as necessary, the device is baked in nitrogen atmosphere at about 150° C. for approximately 60 minutes (S109). The manufacturing method up to this point is the same as the general method of manufacturing a semiconductor device.

In the present invention, the device is baked in a steam atmosphere (S110) at 200° C. to 380° C. for 30 minutes or more, for example at 250° C. for 30 minutes to form the alumina layer. By way of further explanation, the bonding pad is exposed by selectively removing a passivation film, which is formed on the wiring layer containing aluminum, by dry etching using a photosensitive polyimide film or a photo resist as a mask. If the exposed bonding pad is left as is, aluminum hydroxide will be formed which will cause the problem described before. However, in the present invention, baking the semiconductor device for 30 minutes or more at 200° C. to 380° C. in water vapor atmosphere forms a good quality alumina ($Al_2O_3$, aluminum oxide) layer on the surface of the bonding pad. That is, an aluminum hydroxide layer 12 is not formed on the surface of the bonding pad.

Thereafter, the steps are the same as the general method of manufacturing a semiconductor device. The semiconductor wafer is diced into chips (S111), the separated chip is adhered to a lead frame (S112), the bonding pad in a semiconductor device is bonded and connected to the lead frame with an Au wire and the like by the supersonic wave bonding method and the like (S113), and then is further sealed by a mold resin and the like (S114).

On the other hand, the alumina layer can be formed by processing in oxygen plasma or baking in an atmosphere containing only oxygen after the dry etching. However, according to the inventors of the present invention, baking in a steam atmosphere is superior to these methods for forming a good quality alumina, because aluminum fluoride ($AlF_3$) is formed on the surface of the bonding pad by the fluorine ions in the dry etching gas. The bonding between aluminum and fluoride is not broken by the processing in oxygen plasma or baking in an atmosphere where only oxygen is introduced into the $N_2$, so that the good quality alumina cannot be formed.

As is generally known, aluminum fluoride has a chemical characteristic that it is reduced when heated with hydrogen ($H_2$). When aluminum fluoride is heated with water ($H_2O$) at 300° C. to 400° C., alumina ($Al_2O_3$) and hydrogen fluoride (HF) are produced. Since hydrogen fluoride (HF) evaporates, a good quality alumina is formed after the reaction. Therefore, in order to transform aluminum fluoride to alumina, the hydrolysis reaction written as

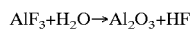

$$AlF_3 + H_2O \rightarrow Al_2O_3 + HF$$

is needed. For this reason, in the present invention, the device is baked in a water vapor-containing environment.

In the present invention, the baking temperature is 200° C. to 380° C. It is possible to bake at 200° C., which is a relatively low temperature, because the reaction takes place close to the surface of the bonding pad. If the baking temperature is higher than 380° C., thermal movement of aluminum atoms and a reflow of the polyimide layer 7 occur. Therefore, the baking temperature 200° C. to 380° C. is proper for a baking temperature.

Figure 3:
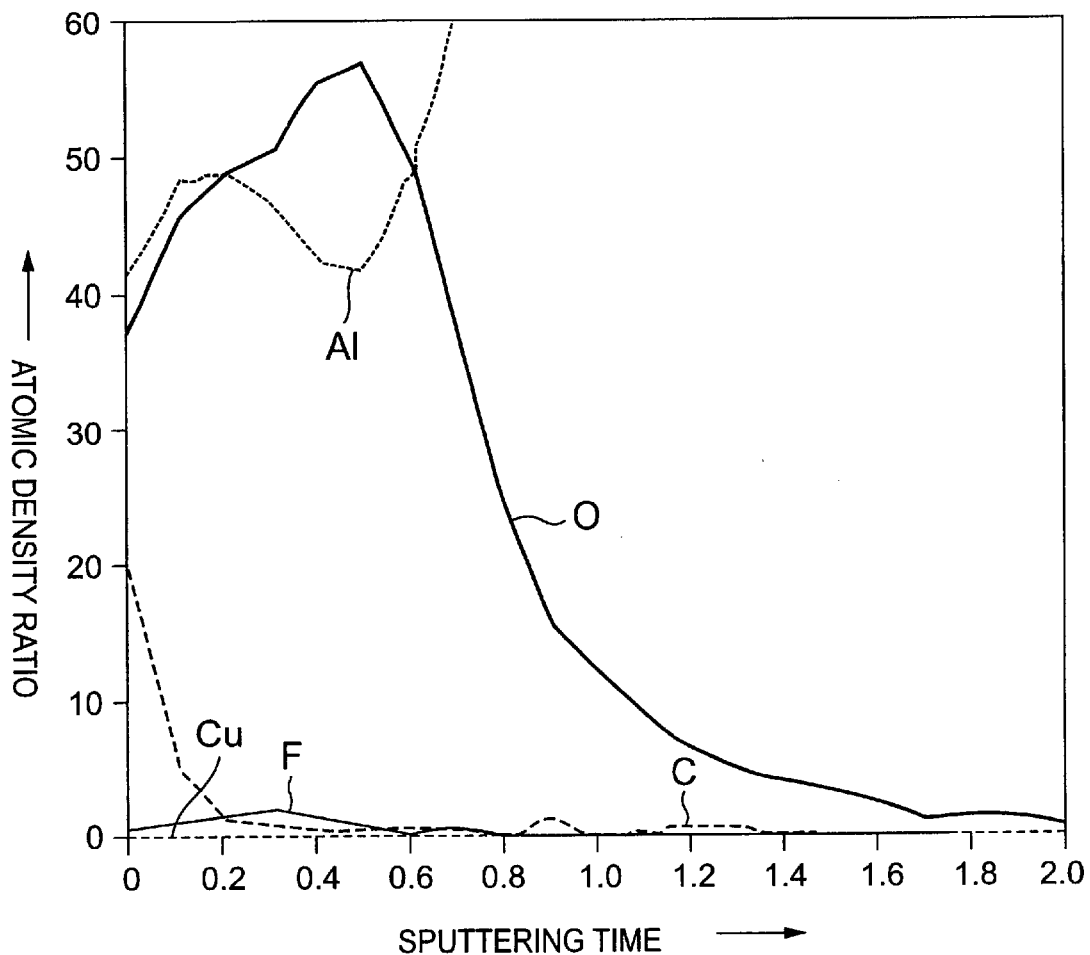
FIG. 3 is a diagram showing an analysis of the surface of a bonding pad of a semiconductor device in the first embodiment of the present invention.
Figure 4:
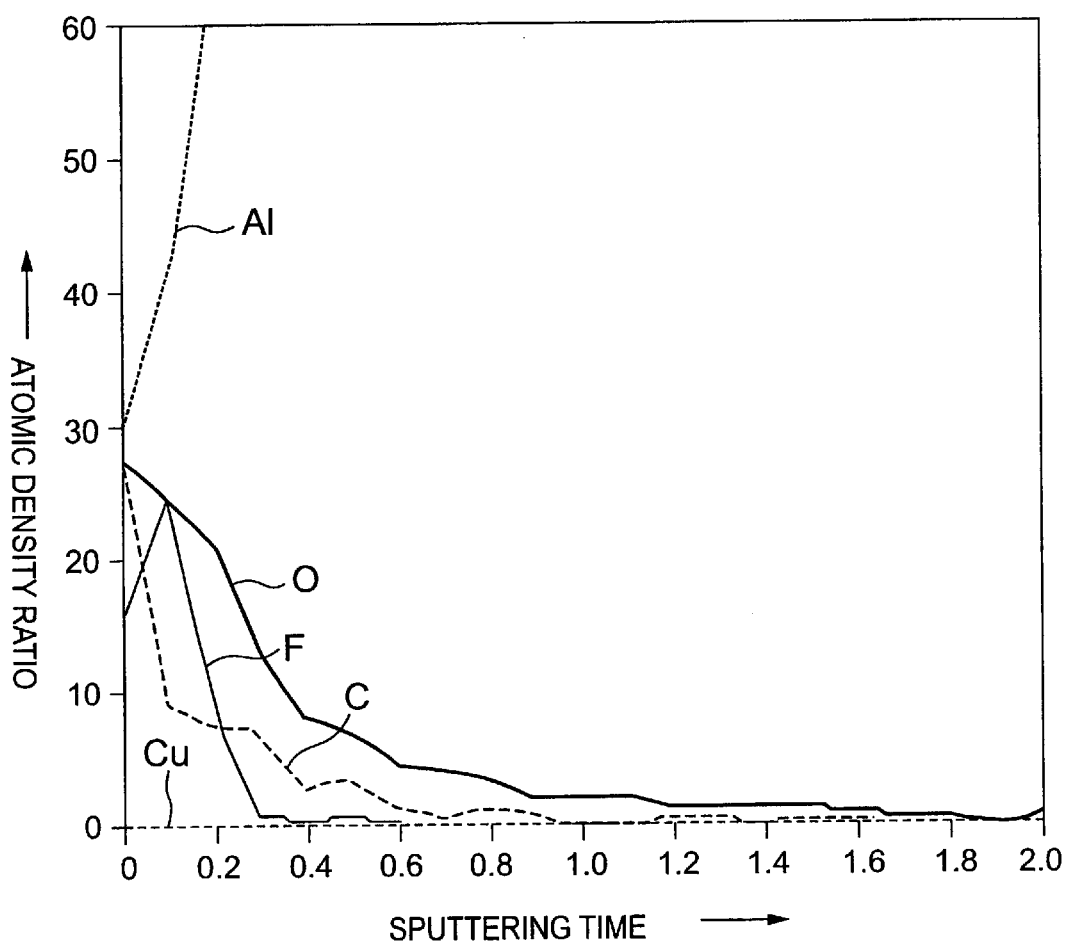
FIG. 4 is a diagram showing an analysis of the surface of a bonding pad of the conventional semiconductor device.

FIGS. 3 and 4 show the Auger electron spectroscopy (AES) analyses of the surface of the bonding pad of the semiconductor device manufactured by the method of the present invention and by the conventional method, respectively.

FIG. 3 shows an atomic density in the direction from the surface of the bonding pad toward the semiconductor substrate in the present invention. The horizontal axis in FIG. 3 (scale 0 to 2.0) is the sputtering time of Auger electron spectroscopy, and 1.0 on the scale corresponds to about 20 nm deep. The vertical axis is the atomic density ratio as a percentage of the whole. Auger electron spectroscopy is used to analyze Auger electrons, which have a characteristic energy depending on the type of element, as a signal which was emitted from the atom by the irradiation of the electron beam.

FIG. 4 shows the result from an analysis on the surface of the bonding pad treated in an $N_2$ atmosphere, which is the conventional method. The horizontal axis, the vertical axis, and their interpretations are the same as in FIG. 3. It is obvious by comparing FIG. 3 and FIG. 4 that there is a large difference between the amount of O (oxygen) and F (fluorine). FIG. 4 shows that the F concentration on the surface of bonding pad which is treated by baking in the $N_2$ atmosphere is high and fluoride is formed on the surface. On the other hand, FIG. 3 shows that on the surface by baking in water vapor atmosphere described in the present invention, the F concentration decreases and the O concentration increases significantly, and oxide about 20 nm thick is formed.

Figure 5:
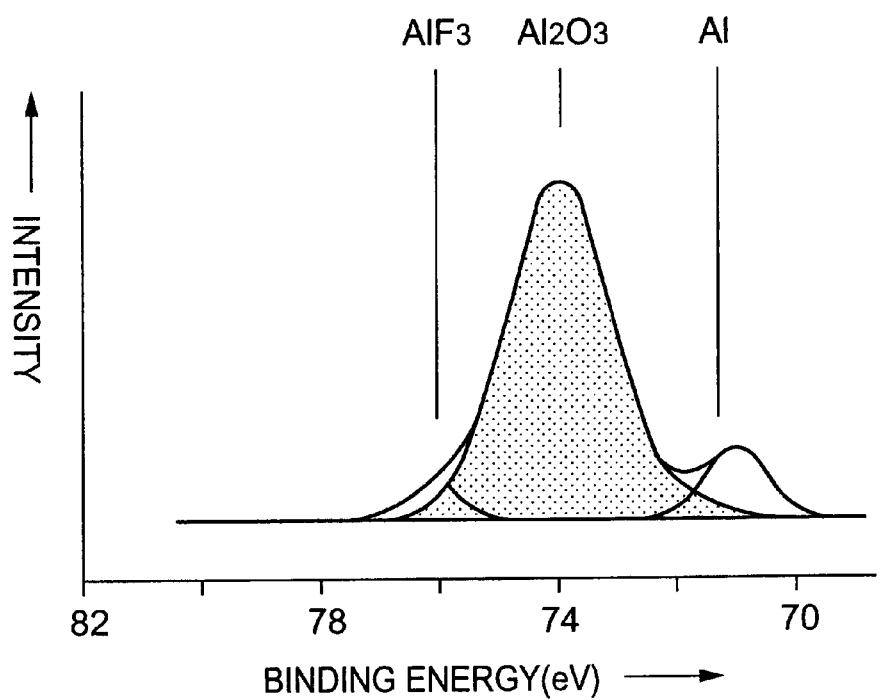
FIG. 5 is a diagram showing another analysis of the surface of the bonding pad of a semiconductor device in the first embodiment of the present invention.
Figure 6:
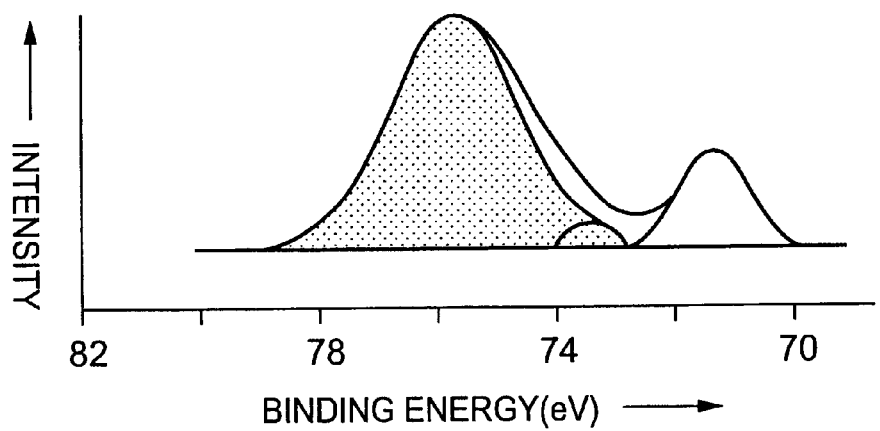
FIG. 6 is a diagram showing another analysis of the surface of a bonding pad of the conventional semiconductor device.

FIGS. 5 and 6 show the result of the scanning x-ray photoelectron spectroscopy for investigating the bonding state of fluoride and oxide. FIG. 5 shows the result of the bonding state by baking in water vapor atmosphere as described in the present invention. FIG. 6 shows the result of the bonding state by baking in an $N_2$ atmosphere which is the conventional method. In FIG. 5 and 6, the horizontal axis shows the bonding energy, and the vertical axis shows the intensity of the spectrum.

The peak of the spectrum intensity in FIG. 6 shows the main component of fluoride is aluminum fluoride ($AlF_3$). On the other hand, in FIG. 5, the main component of oxides is aluminum oxide ($Al_2O_3$, alumina). As shown in the result, by baking in water vapor atmosphere as described in the present invention, a good quality alumina is formed. The mechanism to transform the surface where aluminum fluoride is formed as the main component to the surface where alumina is formed as the main component by baking in water vapor atmosphere is the hydrolysis reaction as described above.

The inventors of the present invention confirmed that no change occurred on the surface of the bonding pad after placing a semiconductor device of the present invention for 6 months in a place where both temperature and humidity are not controlled. Furthermore, as an extreme experiment, the device was placed in an approximately 100% humidity environment, which is an extremely inferior environment, for one month. However, no change occurred on the surface of the bonding pad, which proves that alumina formed on the surface of the bonding pad has the effect of protecting the bonding pad. Therefore, by the present invention, there is no need to keep the device in controlled temperature and humidity and to confine the device in dry air after the completion of the front-end process (after the completion of the bonding pad forming step) until the assembly is completed.

Figure 7:
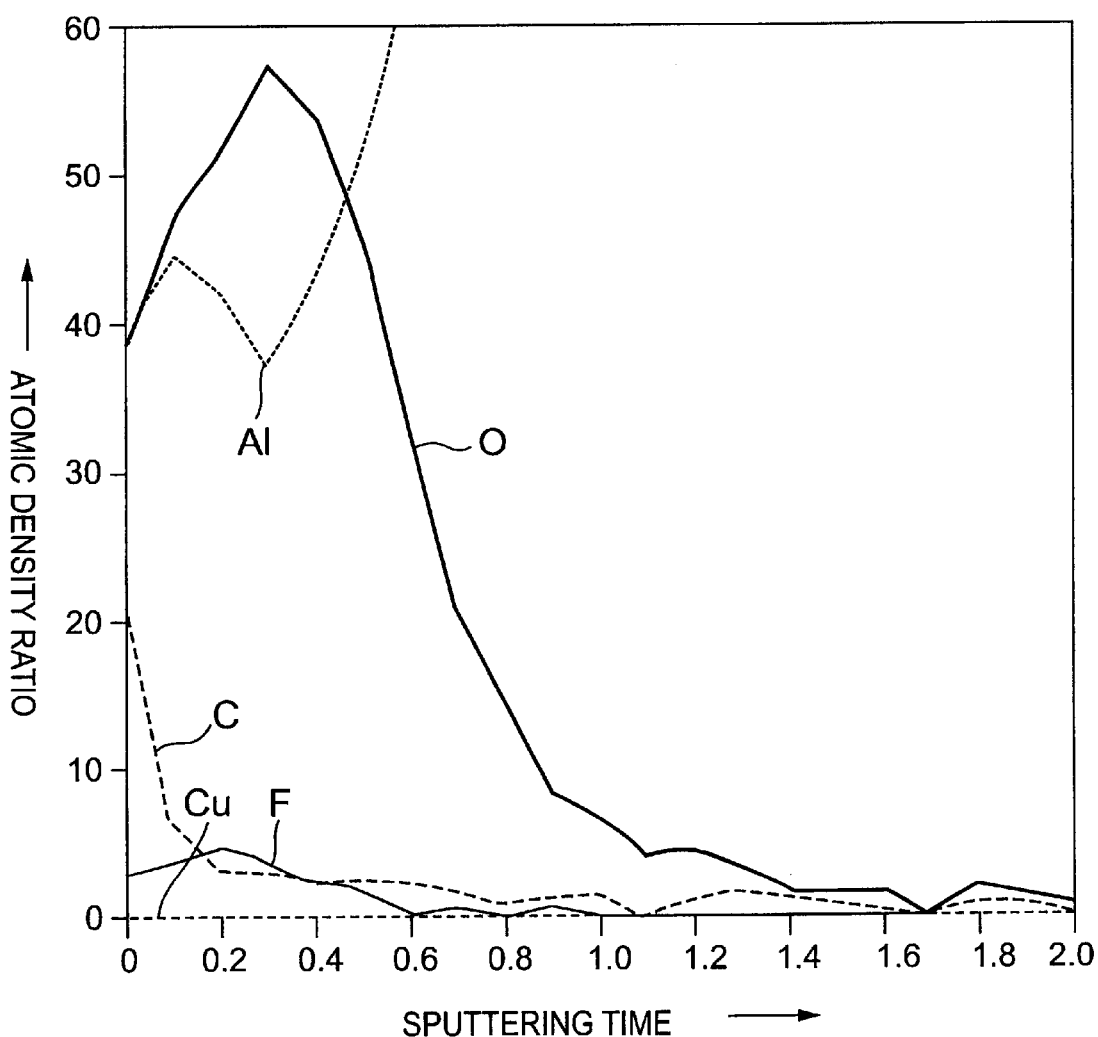
FIG. 7 is a diagram showing an analysis of the surface of a bonding pad of a semiconductor device in the second embodiment of the present invention.
Figure 8:
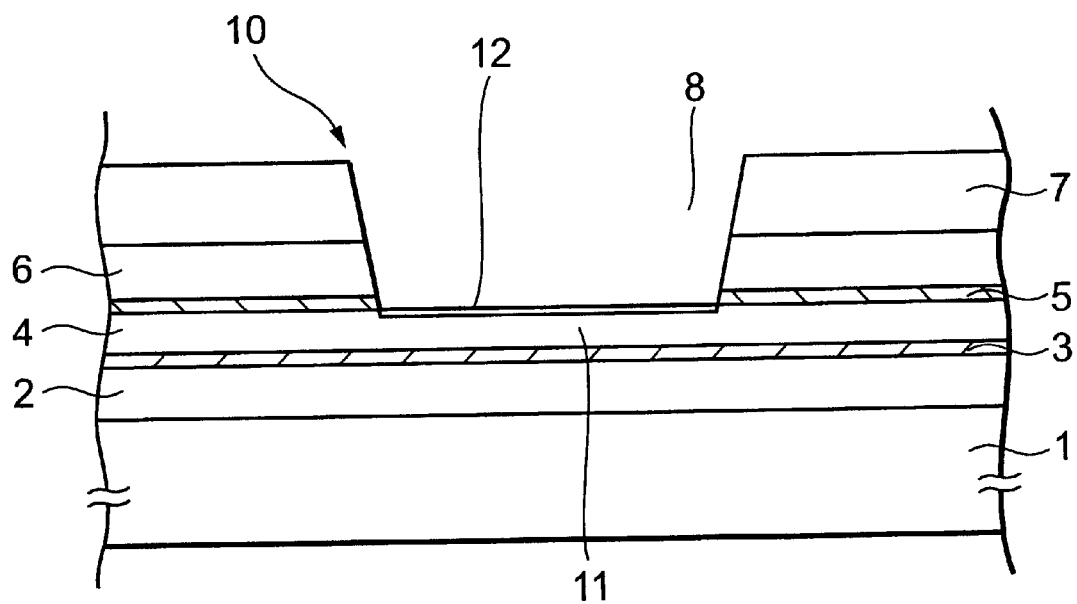
FIG. 8 is a cross sectional view of a conventional semiconductor device.

FIG. 7 shows the analysis result of scanning x-ray photoelectron spectroscopy of a second embodiment.

In this embodiment, air is introduced into the baking chamber. Because air contains water vapor, so that the same reaction as the first embodiment can be obtained by using the second embodiment. Specifically, the characteristics shown in FIG. 7 are obtained, thereby a good quality alumina can be formed on the surface of bonding pad. According to the second embodiment, it is not necessary to add water vapor purposely.

As described above, according to the semiconductor device and the manufacturing method of the present invention, it is not necessary to keep the device in a controlled environment because an aluminum oxide (alumina) layer, which was formed on the surface of the bonding pad after etching the bonding pad and before wire bonding, prevents the surface of the bonding pad from degenerating and prevents formation of a reaction product such as aluminum hydroxide on the surface of the bonding pad before wire bonding.

While preferred embodiments of the present invention have been described, it is to be understood that the invention is to be defined by the appended claims when read in light of the specification and when accorded their full range of equivalents.

What is claimed is:

1. A method of manufacturing a semiconductor device comprising the steps of:

forming a wiring layer on a semiconductor substrate;

forming a passivation film on said wiring layer;

forming a hole in said passivation film to expose a surface of said wiring layer; and forming an alumina film on all of the exposed surface of said wiring layer before bonding a bonding wire thereto.

2. The method as claimed in claim 1, wherein the step of forming said alumina film is performed by baking in a water vapor atmosphere.

3. The method as claimed in claim 1, wherein the step of forming said alumina film is performed by baking in air.

4. The method as claimed in claim 2, wherein said baking step is performed at 200° C. to 380° C.

5. The method as claimed in claim 3, wherein said baking step is performed at 200° C. to 380° C.

6. The method as claimed in claim 4, wherein said baking step is performed for at least 30 minutes.

7. The method as claimed in claim 5, wherein said baking step is performed for at least 30 minutes.

8. The method as claimed in claim 1, wherein a thickness of said alumina film is 10 to 20 nm.

9. The method as claimed in claim 1, wherein the step of forming the hole comprises the step of dry etching with a fluorine gas.

\* \* \* \* \*